United States Patent
Fukasawa et al.

(10) Patent No.: US 7,187,009 B2
(45) Date of Patent: Mar. 6, 2007

(54) LIGHT EMITTING DIODE DEVICE FOR ILLUMINATION OBJECTS

(75) Inventors: Koichi Fukasawa, Yamanashi-ken (JP); Hirohiko Ishii, Yamanashi-ken (JP); Masahide Watanabe, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 35 days.

(21) Appl. No.: 10/652,037

(22) Filed: Sep. 2, 2003

(65) Prior Publication Data
US 2004/0041165 A1    Mar. 4, 2004

Related U.S. Application Data

(62) Division of application No. 10/166,622, filed on Jun. 12, 2002, now Pat. No. 6,638,780.

(30) Foreign Application Priority Data
Jun. 12, 2001   (JP)   ............................. 2001-177821

(51) Int. Cl.
 *H01L 29/22*    (2006.01)
 *H01L 29/227*   (2006.01)
 *H01L 33/00*    (2006.01)

(52) U.S. Cl. .................. 257/98; 257/88; 257/E33.068; 257/E33.001

(58) Field of Classification Search ......... 257/98–100, 257/79, 88, E33.001, E33.068
See application file for complete search history.

(56) References Cited

U.S. PATENT DOCUMENTS

| 5,226,052 A | * | 7/1993 | Tanaka et al. ............... 372/36 |
| 5,723,363 A | * | 3/1998 | Wiese ......................... 438/107 |
| 2004/0069993 A1 | * | 4/2004 | Murano ...................... 257/79 |

FOREIGN PATENT DOCUMENTS

| JP | 357194588 | * 11/1982 |
| JP | 2001-118865 | 4/2001 |

* cited by examiner

*Primary Examiner*—Monica Lewis
(74) *Attorney, Agent, or Firm*—Dennison, Schultz & MacDonald

(57) ABSTRACT

A plurality of LEDs are mounted on a substrate aggregation, a transparent layer is formed on the substrate aggregation. The transparent layer between adjacent divisions is removed to form an individual transparent layer and to form a groove around the individual transparent layer. The groove is filled with a reflector material to form a reflector layer. The reflector layer and the substrate are cut so as to form a reflector film on the outside wall of the individual transparent layer, thereby forming a plurality of LED devices.

2 Claims, 4 Drawing Sheets

LIGHT EMITTING DIODE DEVICE FOR ILLUMINATION OBJECTS

This application is a division of Ser. No. 10/166,622, filed Jun. 12, 2002, now U.S. Pat. No. 6,638,780, issued Oct. 28, 2003.

BACKGROUND OF THE INVENTION

The present invention relates to a method for manufacturing light emitting diode devices. Here, the light emitting diode (LED) device comprises an LED on a substrate, a transparent layer sealing the LED, and a reflection layer on the transparent layer.

FIGS. 6 and 7 are perspective views showing a conventional method for manufacturing LED devices.

Referring to FIG. 6, a plurality of LEDs 2 are securely mounted on a substrate aggregation 1. Each of the LEDs 2 is disposed at a central position of each division for a completed LED device. Each of the LEDs is connected to a circuit on a substrate of the division by bonding wires 3. A reflector aggregation 5 is prepared by the injection molding of a white resin such as liquid crystal polymer, PBT and PPS. The thickness of the reflector aggregation is larger than the height of the bonding wire 3. An opening 6 is formed in the division.

The substrate aggregation 1 and the reflector aggregation 5 are adhered to each other. A transparent resin such as epoxy resin is injected in each opening 6 to form a transparent layer 4. Because of the transparent resin, the transparent layer 4 can not be depicted in FIG. 7. However the reference numeral 4 is written in the figure for the convenience of explanation. Thus, the LED 2 is sealed by the transparent layer 4. After the solidifying of the transparent resin, the substrate aggregation 1 is cut by a dicing blade (not shown) along cutting lines 8, so that a complete LED comprising a substrate 1a, LED 2, a reflector frame 5a, and transparent layer 4 is produced.

In the above described method, it is difficult to coincide thermal expansion coefficients of the transparent resin for the transparent layer 4 and of the resin for the reflector aggregation 5 with each other, since a reflector agent is mixed in the reflector aggregation. As a result, there are troubles such as peel off of the LED, break off of the bonding wires, peel off of the reflector aggregation in heating processes.

Since the reflector aggregation is made by the injection molding, the reflector frame 5a can not be formed into a thin layer. Consequently, the LED device can not be made into a thin thickness.

SUMMARY OF THE INVENTION

An object of the present invention is to provide a method for manufacturing LED devices which resolves the above described troubles and may be made into a small size.

According to the present invention, there is provided a method for manufacturing light emitting diode devices comprising the steps of preparing a substrate aggregation having a plurality of divisions, mounting a plurality of LEDs on the substrate aggregation at the divisions, forming a transparent layer on the substrate aggregation, removing the transparent layer between adjacent divisions to form an individual transparent layer at each of the divisions and to form a groove around the individual transparent layer, filling the groove with a reflector material to form a reflector layer, cutting the reflector layer and the substrate so as to form a reflector film on the outside wall of the individual transparent layer, thereby forming a plurality of LED devices.

The divisions are arranged in matrix. The transparent layer and the reflector layer are made of same kind of resin.

In another aspect of the present invention, a method for manufacturing light emitting diode devices comprising the steps of preparing a substrate aggregation having a plurality of divisions, mounting a plurality of LEDs on the substrate aggregation at the divisions, forming an individual transparent layer at each of the divisions by molding, filling a groove formed between adjacent individual transparent layer with a reflector material to form a reflector layer, cutting the reflector layer and the substrate so as to form a reflector film on an outside wall of the individual transparent layer, thereby forming a plurality of LED devices.

These and other objects and features of the present invention will become more apparent from the following detailed description with reference to the accompanying drawings.

DETAILED DESCRIPTION OF THE PREFERRED EMBODIMENT

Figure 1:
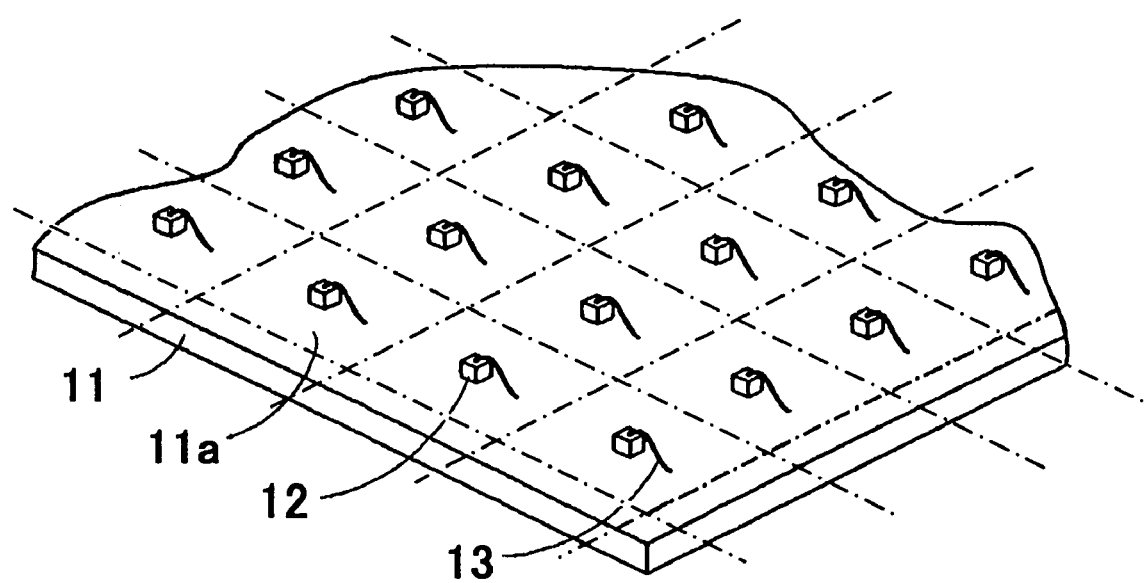
FIGS. 1 through 5 are perspective views showing steps of the manufacturing method of the present invention.

Referring to FIG. 1, a substrate aggregation 11 having a plurality of substrate divisions 11a in matrix is prepared by epoxy resin. A plurality of LEDs 12 are securely mounted on the substrate aggregation 11. Each of the LEDs 12 is disposed at a central position of each substrate division 11a. Each of the LEDs is connected to a circuit on the substrate division 11a by bonding wires 13.

Figure 2:
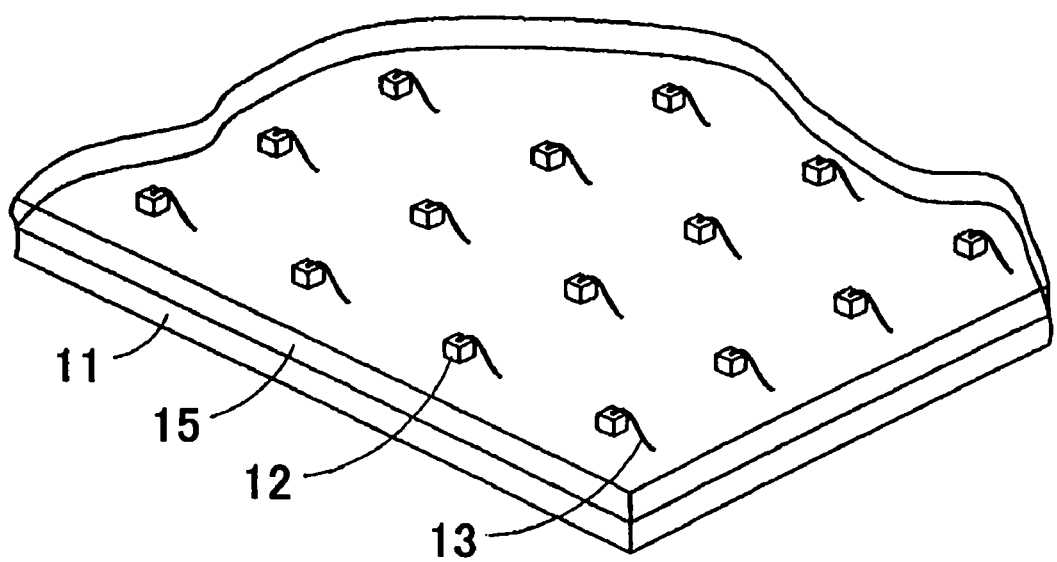

The substrate aggregation 11 is disposed in a molding case (not shown). A transparent resin of epoxy resin is injected in the molding case to seal the LEDs 12 and the bonding wires 13 and solidified, thereby forming a transparent layer 15 on the substrate aggregation 11 as shown in FIG. 2. The solidified sheet is removed from the molding case.

Figure 3:
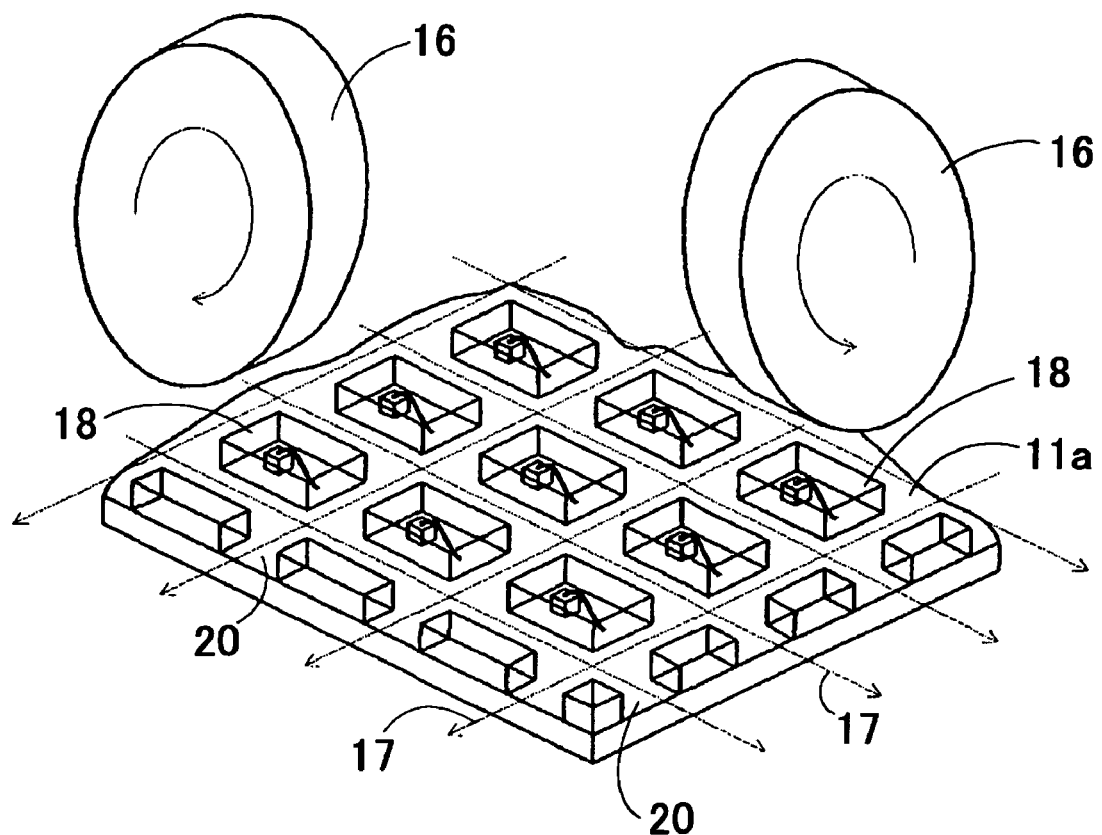

Referring to FIG. 3, the transparent layer 15 between adjacent divisions 11a is removed by a thick dicing blade 16 along cutting lines 17 of matrix to form a lattice groove 20, thereby providing an individual transparent layer 18 at each division.

Figure 4:
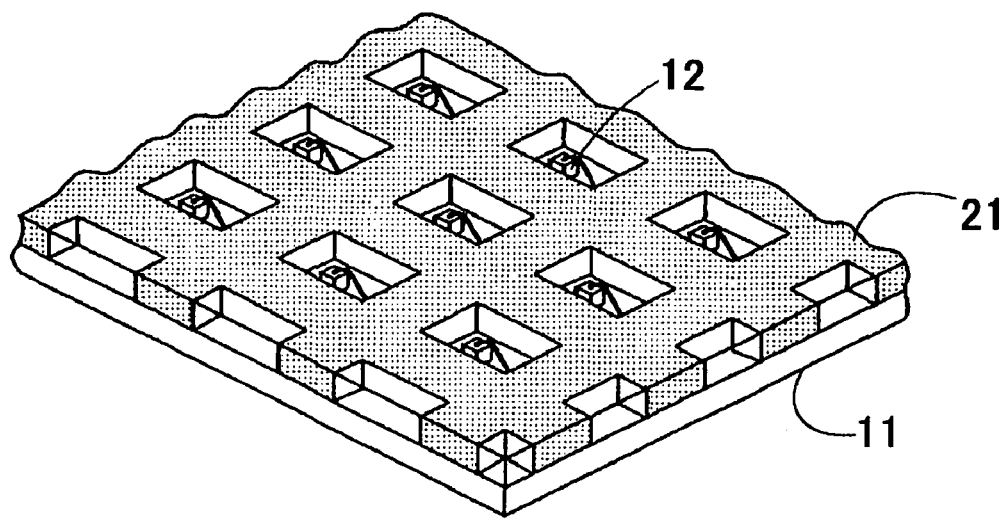

Next, a light reflecting resin of epoxy resin in which white pigment is mixed is injected in the lattice groove 20 to form a reflector layer 21 as shown in FIG. 4. Since the substrate aggregation 11, transparent layer 15 and reflector layer 21 are made of epoxy resin, these members are fixedly adhered to each other.

Figure 5:
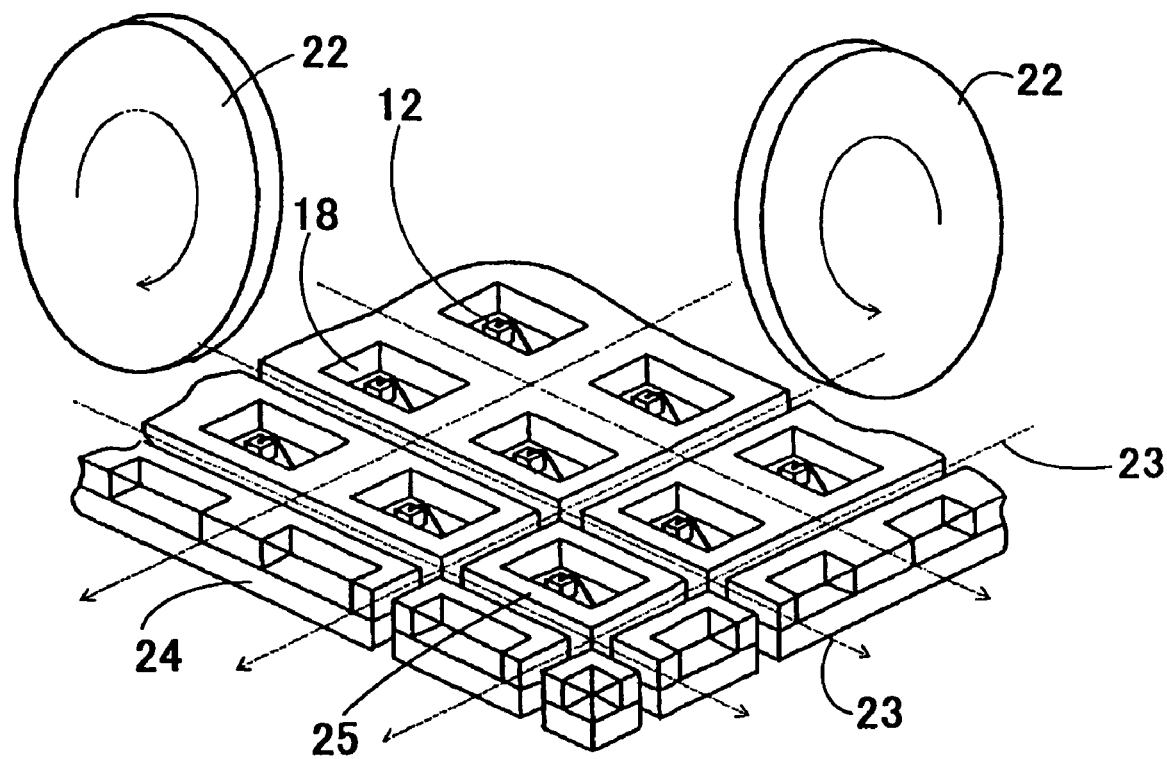
Figure 6:
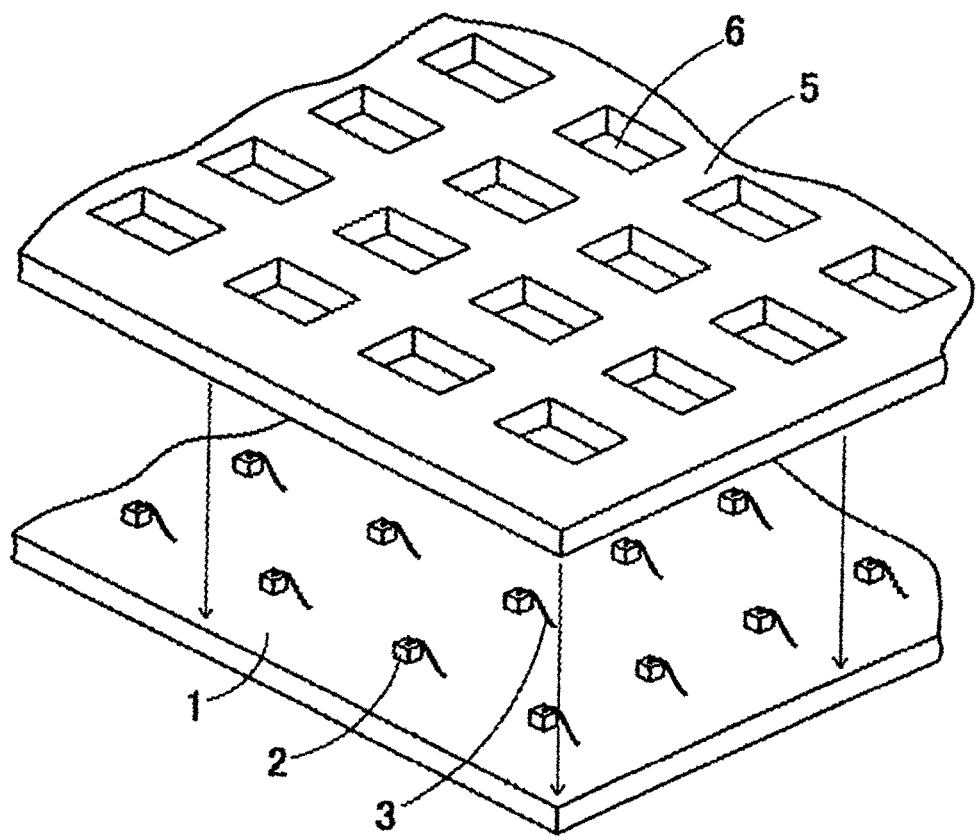
FIGS. 6 and 7 are perspective views showing steps of the conventional manufacturing method.
Figure 7:
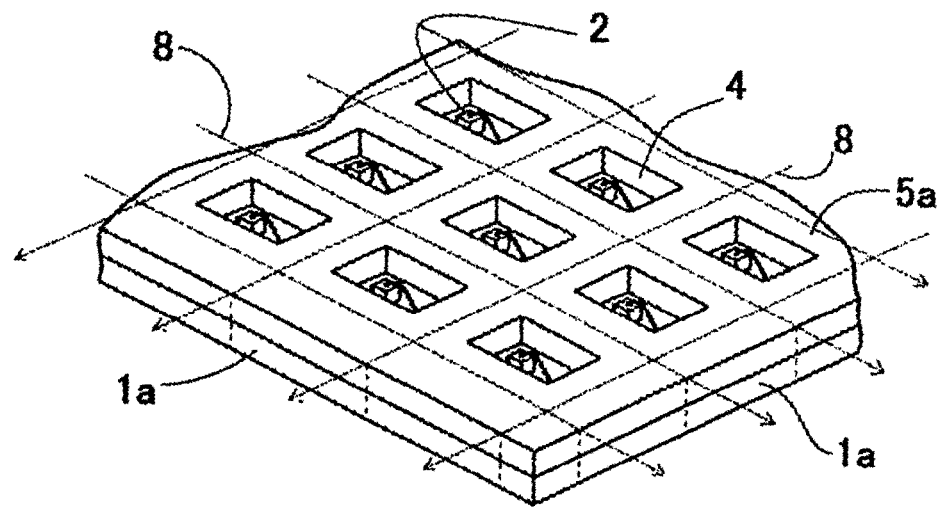

Referring to FIG. 5, adhered substrate aggregation 11 and reflector layer 21 are cut by a thin dicing blade 22 along a matrix cutting lines 23 to provide individual LED devices, remaining a reflector film 25 on the side wall of each LED device. Each LED device comprises a substrate 24, LED 12, transparent layer 18, and reflector film 25.

As another method for forming the individual transparent layers, a mold having a plurality of rectangular through-holes, each hole having the same shape as the individual transparent layer is securely mounted on the substrate aggregation, and epoxy resin is injected in each through-hole so as to seal the LED.

In accordance with the present invention, since the reflector layer is formed into a thin film by cutting, the LED device is made into a small size. The conventional reflector aggregation is adhered on the substrate aggregation. Such an adhesion process may cause positional deviation and leakage of adhesive, resulting in defective product. In the present invention, since there is no adhesion of the reflector aggregation, proper products can be manufactured.

While the invention has been described in conjunction with preferred specific embodiment thereof, it will be understood that this description is intended to illustrate and not limit the scope of the invention, which is defined by the following claims.

What is claimed is:

1. A light emitting diode device comprising:
   a substrate made of resin;
   an LED mounted on the substrate;
   a transparent layer made of transparent resin and sealing the LED; and
   a reflector film made of resin containing white pigment and adhered to peripheral outside walls of the transparent layer, except for an upper surface of the transparent layer as a light emitting surface,
   wherein the substrate, the transparent layer and the reflector film are made of epoxy resin, and the reflector film surrounding the transparent layer has a length and width corresponding to those of the substrate, and a height corresponding to that of the transparent layer, integrated with the transparent layer.

2. The light emitting diode device according to claim 1, wherein the substrate has a plurality of LED's mounted thereon.

* * * * *

UNITED STATES PATENT AND TRADEMARK OFFICE
CERTIFICATE OF CORRECTION

PATENT NO. : 7,187,009 B2 Page 1 of 1
APPLICATION NO. : 10/652037
DATED : March 6, 2007
INVENTOR(S) : Koichi Fukasawa et al.

It is certified that error appears in the above-identified patent and that said Letters Patent is hereby corrected as shown below:

In the Specification:

Amend the title as follows: LIGHT EMITTING DIODE DEVICE FOR ~~ILLUMINATION~~ ILLUMINATING OBJECTS In the Claims:

Claim 2, line 2, change "LED'S" to --LEDs--.

Signed and Sealed this

Eighteenth Day of December, 2007

JON W. DUDAS
*Director of the United States Patent and Trademark Office*